(12) United States Patent
Khurana

(10) Patent No.: US 8,072,589 B2
(45) Date of Patent: Dec. 6, 2011

(54) SYSTEM AND METHOD FOR PHOTOEMISSION-BASED DEFECT DETECTION

(75) Inventor: Neeraj Khurana, Monte Sereno, CA (US)

(73) Assignee: DCG Systems, Inc., Fremont, CA (US)

( * ) Notice: Subject to any disclaimer, the term of this patent is extended or adjusted under 35 U.S.C. 154(b) by 410 days.

(21) Appl. No.: 12/326,859

(22) Filed: Dec. 2, 2008

(65) Prior Publication Data

US 2009/0150098 A1 Jun. 11, 2009

Related U.S. Application Data

(63) Continuation-in-part of application No. 11/624,553, filed on Jan. 18, 2007, now Pat. No. 7,636,155.

(51) Int. Cl.
*G01N 21/00* (2006.01)
(52) U.S. Cl. .......... 356/237.1; 356/237.6; 702/58; 702/179; 702/85
(58) Field of Classification Search .... 356/237.1–237.6; 702/57, 58, 85, 179
See application file for complete search history.

(56) References Cited

U.S. PATENT DOCUMENTS

| | | | |
|---|---|---|---|
| 5,055,668 A * | 10/1991 | French | 250/208.2 |
| 5,208,648 A | 5/1993 | Batchelder et al. | |
| 5,220,403 A | 6/1993 | Batchelder et al. | |
| 5,940,545 A | 8/1999 | Kash et al. | |
| 7,187,438 B2 * | 3/2007 | Hamamatsu et al. | 356/237.4 |
| 7,636,155 B2 * | 12/2009 | Khurana | 356/237.1 |

OTHER PUBLICATIONS

Yee, W.M., et al., "Laser Voltage Probe (LVP): A Novel Optical Probing Technology for Flip-Chip Packaged Microprocessors," *International Symposium for Testing and Failure Analysis (ISFTA)*, 2000, pp. 3-8.
Bruce, Mike, et al., "Waveform Acquisition from the Backside of Silicon Using Electro-Optic Probing," *Proceedings from the 25th International Symposium for Testing and Failure Analysis*, Nov. 14-18, 1999, pp. 19-25.
Kolachina, S., et al., "Optical Waveform Probing—Strategies for Non-Flipchip Devices and Other Applications," *International Symposium for Testing and Failure Analysis (ISFTA)*, 2001, pp. 51-57.
Soref, Richard A., et al., "Electrooptical Effects in Silicon," *IEEE Journal of Quantum Electronics*, Jan. 1987, vol. QE-23 No. 1.
Kasapi, Steven, et al., "Laser Beam Backside Probing of CMOS Integrated Circuits," *Microelectronics Reliability*, 1999, pp. 957-961, 39.

(Continued)

*Primary Examiner* — Gregory J Toatley
*Assistant Examiner* — Iyabo S Alli
(74) *Attorney, Agent, or Firm* — Nixon Peabody LLP; Joseph Bach, Esq.

(57) ABSTRACT

An IREM image of an IC is obtained. The emission intensity at each emission site is measured/calculated and is compared to reference intensity. The calculated intensity may be plotted against reference intensities. In general, the majority of the plotted intensities would lie in a given range within a straight line. However, for devices that exhibit an abnormal emission, the plot would result in an easily observable deviation from the line. The calculated intensity is used to make a determination of logical "1" or "0" for each device, which is automatically stored together with the corresponding test vector. The calculated logical states are then tabulated and compared against tabulation of reference logical states.

25 Claims, 15 Drawing Sheets
(2 of 15 Drawing Sheet(s) Filed in Color)

OTHER PUBLICATIONS

Wilsher, Ken, et al., "Integrated Circuit Waveform Probing Using Optical Phase Shift Detection," *Proceedings from the 26th Internationsl Symposium for Testing and Failure Analysis*, Nov. 12-16, 2000, pp. 479-485, Bellevue, Washington.

Heinrich, H.K., "Picosecond Noninvasive Optical Detection of Internal Electrical Signals in Flip-Chip-Mounted Silicon Integrated Circuits," *IBM J. Res. Development*, Mar./May 1990, vol. 34, No. 2/3.

Heinrich, H.K., et al., "Noninvasive Sheet Charge Density Probe for Integrated Silicon Devices," *Appl. Phys. Lett.* 48 (16), Apr. 21, 1986, American Institute of Physics.

Hemenway, B.R., et al., "Optical Detection of Charge Modulation in Silicon Integrated Circuits Using a Multimode Laser-Diode Probe," *IEEE Electron Device Letters*, Aug. 1987, Voo. EdL-8, No. 8.

Black, A. et al., "Optical Sampling of GHz Charge Density Modulation in Silicon Bipolar Junction Transistors, "Electronics Letter, 1987, vol. 23, No. 15, pp. 783-784.

Heinrich, H.K., et al., "Erratum: Noninvasive Sheet Charge Density Probe for Integrated Silicon Devices," *Appl. Phys. Lett.* 1986, 48, 1066.

Heinrich, H.K., et al., "Measurement of Real-Time Digital Signals in a Silicon Bipolar Junction Transistor Using A Noninvasive Optical Probe," *IEEE Electronics Letters*, Jun. 5, 1986, pp. 650-652, vol. 22, No. 12.

Bockelman, Daniel R., et al., "Infrared Emission-based Static Logic State Imaging on Advanced Silicon Technologies," *Proceedings from the 28th International symposium for Testing and Failure Analysis*, Nov. 3-7, 2002, pp. 531-537, Pheonix, Arizona.

* cited by examiner

Table 3

| STATE | A B C |
|---|---|
| 1 | 000 |
| 2 | 100 |
| 3 | 010 |
| 4 | 001 |
| 5 | 110 |
| 0 | 011 |
| 7 | 101 |
| 8 | 111 |

| BLENDED DATA.... ??? | | BLENDED VERDICT | Actual Value | Cumm. ON Probability |
|---|---|---|---|---|
| INTENSITY | Sigma(+/-) | | | |
| A weighted | 3093.34 | 220.79 | ON | 3000 | 77.4% |
| B weighted | 15.20 | 292.84 | ? | 0 | 34.1% |
| C weighted | 3128.77 | 220.60 | ON | 3000 | 77.8% |

*Table 6*

Table 1

| CELL NAME | ANALOG MODE- EMISSION INTENSITY | | | TEST/REF CORRELATION |
|---|---|---|---|---|
| | TRANSISTOR NAME | TEST DEVICE INTENSITY | REFERENCE DEVICE INTENSITY | |
| FILE-INPUT A | N1 | 745 | 600 | 95% |
| FILE-INPUT A | N2 | 2 | 1 | 80% |
| FILE-INPUT A | P1 | 2 | 3 | 90% |
| FILE-INPUT A | P2 | 26 | 20 | 96% |
| FILE-CONTROL A | N1 | 1 | 2 | 80% |
| FILE-CONTROL A | N2 | 3 | 2 | 90% |
| FILE-CONTROL A | N3 | 2 | 3 | 90% |
| FILE-CONTROL A | P1 | 25 | 21 | 96% |
| FILE-CONTROL A | P2 | 27 | 20 | 95% |
| FILE-CONTROL A | P3 | 26 | 21 | 96% |
| FILE-CONTROL B | N1 | 700 | 602 | 98% |
| FILE-CONTROL B | N2 | 698 | 604 | 96% |
| FILE-CONTROL B | N3 | 702 | 610 | 95% |
| FILE-CONTROL B | P1 | 2 | 3 | 90% |
| FILE-CONTROL B | P2 | 3 | 3 | 97% |
| FILE-CONTROL B | P3 | 2 | 2 | 96% |
| FILE-CONTROL C | N1 | 2 | 1 | 80% |
| FILE-CONTROL C | N2 | 1 | 3 | 75% |
| FILE-CONTROL C | N3 | 3 | 2 | 90% |
| FILE-CONTROL C | P1 | 25 | 19 | 98% |
| FILE-CONTROL C | P2 | 26 | 21 | 95% |
| FILE-CONTROL C | P3 | 27 | 20 | 96% |
| FILE-INPUT B | N1 | 102 | 636 | 0.02% |
| FILE-INPUT B | P1 | 2 | 3 | 90% |
| FILE-INPUT C | N1 | 620 | 500 | 96% |
| FILE-INPUT C | P1 | 3 | 2 | 90% |

| CELL NAME | TEST DEVICE | DIGITAL MODE REFERENCE DEVICE | THEORETICAL VALUE |
|---|---|---|---|
| FILE-INPUT A | 1 | 1 | 1 |
| FILE-CONTROL A | 0 | 0 | 0 |
| FILE-CONTROL B | 1 | 1 | 1 |
| FILE-CONTROL C | 0 | 0 | 0 |
| FILE-INPUT B | 1 | 0 | 0 |
| FILE- INPUT C | 0 | 0 | 0 |
| REGISTER-A1 | 1 | 1 | 1 |
| REGISTER-B1 | 1 | 1 | 1 |
| REGISTER-C1 | 0 | 0 | 0 |
| REGISTER-A2 | 1 | 1 | 1 |
| REGISTER-B2 | 1 | 1 | 1 |
| REGISTER-C2 | 1 | 1 | 1 |
| REGISTER-A3 | 0 | 0 | 0 |
| REGISTER-B3 | 0 | 1 | 1 |
| REGISTER-C3 | 0 | 0 | 0 |
| REGISTER-A4 | 1 | 1 | 1 |
| REGISTER-B4 | 0 | 0 | 0 |
| REGISTER-C4 | 0 | 0 | 0 |
| ANOMALOUS EMISSION SITE IN CELL NAME- REGISTER B3 | RECOMMENDED ACTION:-NAVIGATE TO CONTROL- B3 | | |

*Table 2*

DATA SUMMARY TABLE

Table 4

| STATE | INTENSITY | | | SIGMA(+-) | | | STATISTICS | | |
|---|---|---|---|---|---|---|---|---|---|
| | tA | tB | tC | tSigA | tSigB | tSigC | tChiSq | tChiDist | tFdist |
| 000 | 0.00 | 0.00 | 0.00 | 0.00 | 0.00 | 0.00 | 7087.97 | 0.00 | 0.00% |
| 100 | 5683.38 | 0.00 | 0.00 | 107.44 | 0.00 | 0.00 | 652.43 | 0.00 | 0.00% |
| 010 | 0.00 | 5956.67 | 0.00 | 0.00 | 110.04 | 0.00 | 221.86 | 0.00 | 10.72% |
| 001 | 0.00 | 0.00 | 5714.51 | 0.00 | 0.00 | 107.42 | 653.29 | 0.00 | 0.00% |
| 110 | 418.14 | 5556.36 | 0.00 | 280.84 | 288.92 | 0.00 | 219.31 | 0.00 | 11.50% |
| 011 | 0.00 | 5498.56 | 481.15 | 0.00 | 288.86 | 281.07 | 218.63 | 0.00 | 11.92% |
| 101 | 3101.31 | 0.00 | 3136.71 | 158.45 | 0.00 | 158.61 | 177.66 | 0.26 | 65.86% |
| 111 | 3493.73 | -755.47 | 3529.27 | 574.03 | 1061.85 | 574.38 | 176.84 | 0.25 | 0.00% |

Table 5

| STATE | INTENSITY | | | SIGMA(+-) | | | STATISTICS | | |
|---|---|---|---|---|---|---|---|---|---|
| | tA | tB | tC | tSigA | tSigB | tSigC | tChiSq | tChiDist | tFdist |
| POOLED | 3093.34 | 15.20 | 3128.77 | 220.79 | 292.84 | 220.60 | 177.69 | | |

| 'Transis...' | Intensity | Xmin | Xmax | Ymin | Ymax | 'Estimate' | 'Sigma' | 'ON/OFF' | 'Probab...' |
|---|---|---|---|---|---|---|---|---|---|
| 1 | 1000 | 4 | 10 | 6 | 6 | 1102.2 | 88.55 | 'ON' | 0.99819 |
| 2 | 2000 | 5 | 8 | 10 | 10 | 1999.5 | 159.19 | 'ON' | 0.99873 |
| 3 | 3000 | 40 | 47 | 5 | 5 | 3023 | 92.256 | 'ON' | 1 |
| 4 | 4000 | -4 | -4 | 2 | 20 | 3997.9 | 32.295 | 'ON' | 1 |
| 5 | 5000 | 70 | 76 | -20 | -20 | 5068.1 | 63.679 | 'ON' | 1 |
| 6 | 6000 | 40 | 47 | 7 | 7 | 6079.5 | 94.437 | 'ON' | 1 |
| 7 | 7000 | -30 | -30 | -32 | -38 | 6874.5 | 69.181 | 'ON' | 1 |
| 8 | 8000 | -30 | -30 | -30 | 10 | 8030.4 | 23.123 | 'ON' | 1 |
| 9 | 9000 | -28 | 0 | -29 | -31 | 9000.4 | 27.89 | 'ON' | 1 |
| 10 | 10000 | -2 | 10 | 8 | 8 | 9896.2 | 72.292 | 'ON' | 1 |
| 11 | 6000 | 60 | 60 | 0 | 20 | 5914.2 | 160.16 | 'ON' | 1 |
| 12 | 0 | 61 | 61 | 0 | 20 | 153.98 | 291.91 | '?' | 0.4993 |
| 13 | 6000 | 62 | 62 | 0 | 20 | 5935.8 | 161.38 | 'ON' | 1 |
| 14 | 0 | 0 | 1 | 50 | 50 | 56.01 | 561.22 | '?' | 0.22461 |
| 15 | 25000 | 2 | 3 | 50 | 50 | 23493 | 1417.8 | 'ON' | 0.99959 |
| 16 | 0 | 4 | 5 | 50 | 50 | 811.84 | 1031 | '?' | 0.55934 |
| 17 | 25000 | 0 | 1 | 52 | 52 | 24993 | 1127.2 | 'ON' | 0.99996 |
| 18 | 0 | 2 | 3 | 52 | 52 | 2616.5 | 2337 | '?' | 0.67231 |
| 19 | 25000 | 4 | 5 | 52 | 52 | 23891 | 1239 | 'ON' | 0.9998 |
| 20 | 0 | 0 | 1 | 54 | 54 | 118.43 | 645.52 | '?' | 0.44438 |
| 21 | 25000 | 2 | 3 | 54 | 54 | 24677 | 968.27 | 'ON' | 0.99996 |
| 22 | 0 | 4 | 5 | 54 | 54 | 1.109e-... | 0.029079 | 'OFF' | 0.0006... |

*Table 7*

SYSTEM AND METHOD FOR PHOTOEMISSION-BASED DEFECT DETECTION

RELATED APPLICATIONS

This application claims priority from and is a Continuation in Part of U.S. application Ser. No. 11/624,553, filed Jan. 18, 2007, the entire disclosure of which is incorporated herein by reference.

BACKGROUND

1. Field of the Invention

The subject invention relates to test and debug of semiconductor chips using device photoemission.

2. Related Art

It has been well known in the art that semiconductor devices emit light upon change of states, e.g. transistors switching on/off. This phenomenon has been used successfully to test and debug semiconductor circuits using, e.g., infrared emission microscopy (IREM) and time-resolved emission microscopy. It has also been known in the art to use lasers to test and debug semiconductor circuits by examining modulations in the reflected laser light. The technique is generally referred to as LP (laser probing). For more information the reader is directed to review U.S. Pat. Nos. 5,208,648, 5,220,403 and 5,940,545, which are incorporated herein by reference in their entirety. Additional related information can be found in Yee, W. M., et al. *Laser Voltage Probe (LVP). A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of Silicon Using Electro-Optic Probing*, in International Symposium for Testing and Failure Analysis (ISTFA), 1999, p 19-25; Kolachina, S. et al. *Optical Waveform Probing—Strategies for Non-Flip-chip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., *Laser Beam Backside Probing of CMOS Integrated Circuits*. Microelectronics Reliability, 1999. 39: p. 957; Wilsher, K., et al. *Integrated Circuit Waveform Probing Using Optical Phase Shift Detection*, in International Symposium for Testing and Failure Analysis (ISTFA), 2000, p. 479-85; Heinrich, H. K., *Picosecond Noninvasive Optical Detection of Internal Electrical Signals in Flip-Chip-Mounted Silicon Integrated Circuits*. IBM Journal of Research and Development, 1990. 34(2/3): p. 162-72; Heinrich, H. K., D. M. Bloom, and B. R. Hemenway, *Noninvasive sheet charge density probe for integrated silicon devices*. Applied Physics Letters, 1986. 48(16): p. 1066-1068; Heinrich, H. K., D. M. Bloom, and B. R. Hemenway, *Erratum to Noninvasive sheet charge density probe for integrated silicon devices*. Applied Physics Letters, 1986. 48(26): p. 1811; Heinrich, H. K., et al., *Measurement of real-time digital signals in a silicon bipolar junction transistor using a noninvasive optical probe*. IEEE Electron Device Letters, 1986. 22(12): p. 650-652; Hemenway, B. R., et al., *Optical detection of charge modulation in silicon integrated circuits using a multimode laser-diode probe*. IEEE Electron Device Letters, 1987. 8(8): p. 344-346; A. Black, C. Courville, G. Schultheis, H. Heinrich, *Optical Sampling of GHz Charge Density Modulation in Silicon Bipolar Junction Transistors* Electronics Letters, 1987, Vol. 23, No. 15, p. 783-784, all of which are incorporated herein by reference in their entirety.

Recently a new phenomenon has been discovered that can also be utilized in test and debug of semiconductor devices. With the shrinking of the size of new devices, the devices are made "leaky" so that electron-hole recombination occurs during the static off state of the device, leading to photon (~IR) emission. This emission increases as design rule decreases. That is, this phenomenon will express itself more pronouncedly as device generation progresses. This static emission may also be used for debug and test of semiconductor circuits. For example, it has been suggested to use digital imaging software to overlay IREM images of static emissions over the die layout to investigate which elements emit photons. It was suggested to also overlay the state of each device over the IREM image to determine whether the emission means a "1" or "0" logical state. This manual methodology was used to investigate defects by imaging a device in two different logical states and observing whether the emission state has changed. For more information on this phenomenon and the image overlay methodology, the reader is directed to *Infrared Emission-based Static Logic State Imaging on Advanced Silicon Technologies*, Daniel R. Bockelman, Steve Chen, and Borna Obradovic; Proceedings from the 28th International Symposium for Testing and Failure Analysis, 3-7 Nov. 2002, Phoenix, Ariz., which is incorporated herein by reference in its entirety.

As can be understood from the above description and cited publication, while the image overlay technique may help investigate a failure, it is slow, tedious, and becomes more difficult as device generation advance and devices become smaller and denser. That is, the image overlay methodology requires the ability to obtain an image of sufficient resolution so that the various devices and emissions may be distinguished from each other and from surrounding noise. Moreover, photon emission from devices is a statistical phenomenon, so comparison of images using image editing software may provide erroneous conclusion unless the image is obtained over a statistically sufficiently long exposure duration or by performing the comparison over sufficiently large number of IREM images.

As devices get smaller and closely packed with newer generations, beneficial use of the emission detection techniques can only be made if the location of the emission can be isolated and accurately linked to the devices that actually emit the light. Similar issue applies to laser-based systems, i.e., to use such tester one must resolve which device caused the modulation in the reflected laser light. However, as design rule shrinks, the density of the devices increases, making it very difficult and sometimes impossible to isolate the device that emits the light or modulates the laser beam. Additionally, emissions from neighboring devices enter the optical path of the testing system, thereby further complicating the task of isolating the emitting or modulating device. Ironically, while design rule shrinking leads to improved static emission, it also makes it more difficult to isolate the emitting devices.

In order to enable progress in the semiconductor industry pursuant to "Moore's Law," designers will continue to decrease design rules and increase device density. Therefore, the need for debug and testing becomes increasingly indispensable and the difficulty of resolving emitting/modulating devices must be solved.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the subject invention provide means for isolating faulty or malfunctioning devices in an integrated circuit. Generally speaking, faulty device refers to a device that failed to assume the required logical state; while malfunctioning device refers to a device that assumes the proper logical state, but its performance (e.g., speed, threshold voltage, etc.) deviates from the required performance. Embodiments of the invention may be applied to various emission microscopy systems, such as static emission and dynamic emission, or used as a stand-alone system.

According to various aspects of the invention, an IREM image of an IC is obtained. The emission intensity at each emission site is measured/calculated. The calculated intensity is then plotted against reference intensities, i.e., calculated emission of each corresponding site of properly functioning device. The reference intensities may be obtained by simulation, by calculation of intensities of a known properly operating device, by a function calculated from several devices, etc. In general, the majority of the plotted intensities would lie in a given range within a straight line, regardless of the absolute value of the intensity of each device. However, for devices that exhibit an abnormal emission, the plot would result in an easily observable deviation from the line. This may be caused by a soft defect, such as early or late switching of the device, a statistical fluctuation of the device's fabrication process parameters, or by a "killer" defect, such as a short or open circuit.

According to yet other aspects of the invention, the calculated intensities of a given group of devices or all of the devices of an IC are tabulated. Then a correlation is calculated against a tabulation of reference intensities. A threshold is set to make a determination of when a calculated correlation signifies an abnormality.

According to yet further aspects of the invention, the calculated intensity is used to make a determination of logical "1" or "0" for each device. The calculated logical states are then tabulated and compared against tabulation of reference logical states. Furthermore, the tabulated logical state may be used in a die-to-die comparison fashion to detect malfunctioning devices. This may be done as a comparison within an IC when there are repeating patters, such as in a memory IC, or for comparison between different IC's. The logical "1" and "0" states are automatically stored for every test vector.

According to further aspects of the invention, the intensity calculation is performed using a point spread function, and is convolved with the CAD data of the potential devices involved in the emission. The resulting convolved spread function of the transistor is compared with the actual measured signal and the difference between the convolved signal and the measured signal is examined. The calculated signal intensity of the devices is varied until the difference between the calculated signal and the measured signal is minimized. The value of the calculated intensity for the minimum difference is used as the calculated intensity of the device.

According to further aspect of the invention, when the emitting devices are too close to be able to resolve optically, the point spread function methodology is used to resolve the emitting devices. The best fit is performed for each on/off state for all configurations of the devices that are within the observed, but unresolved emission. The variance of the best curve fit for all of the configurations is used to assign probability to each state. Generally, the best fit, i.e., smallest variance would immediately lead to the correct solution. That is, the best fit would indicate the correct state of each of the involved devices, thereby indicating which devices emit and in the process providing intensity values for each emitting device. At times, when the transistors are extremely close, a weighted solution is calculated. The weights are based on the probability of each solution. This entire calculation may be repeated several times while changing the CAD alignment. The results having the smallest variance are taken as the correct CAD alignment.

A method is described for detecting defective devices in integrated circuit (IC) using photon emission, the method comprising obtaining an emission image from an area of the IC; determining intensity values to provide determined intensity of emission from each device present in the area of the IC; obtaining reference intensity corresponding to each device; and comparing each determined intensity to corresponding reference intensity.

A system for identifying malfunctioning and faulty devices using photon emission collected from a device under test (DUT) is described, the system comprising: a first input receiving image signal correlating to the photon emission collected from a selected area of the DUT; a processor receiving the image signal and determining emission intensity for each device within the selected area; a storage having reference intensities stored therein; a comparator comparing each of the determined emission intensities to a corresponding reference intensity; and, an output circuit outputting the comparison results.

An optical tester for testing a semiconductor device under test (DUT) is described, the tester comprising: a collection optics for collecting photon emission from the DUT; a sensor for sensing the photon emission from the collection optics and generating an emission signal; a processor receiving the emission signal and determining emission intensity for each device within the selected area; a logic state module determining a logic state for each device; and, a storage storing the logic state of each device together with a corresponding test vector.

An optical tester for testing a semiconductor device under test (DUT) is provided, comprising: a collection optics for collecting light from the DUT; a sensor for sensing the light from the collection optics and generating a collection signal; an input for receiving CAD layout of the DUT; a calculator for calculating emission intensities for each device of interest; and a comparator comparing the calculated intensities to reference intensities.

BRIEF DESCRIPTION OF THE DRAWINGS

The patent or application file contains at least one drawing executed in color. Copies of this patent or patent application publication with color drawings will be provided by the Office upon request and payment of the necessary fee.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

Figure 9:
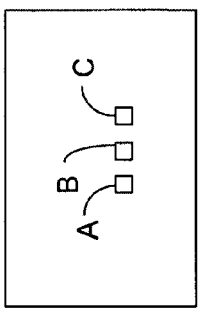
FIG. 9 is an illustration of a part of a semiconductor chip, having three transistors, A, B, and C, closely spaced thereupon, for explaining an embodiment of the subject invention.

Table 2 illustrates an example of calculated intensity converted to a logical state for each device;

Table 3 illustrates an example of the various states that may be assumed by the three transistors shown in FIG. 9.

Figure 1:
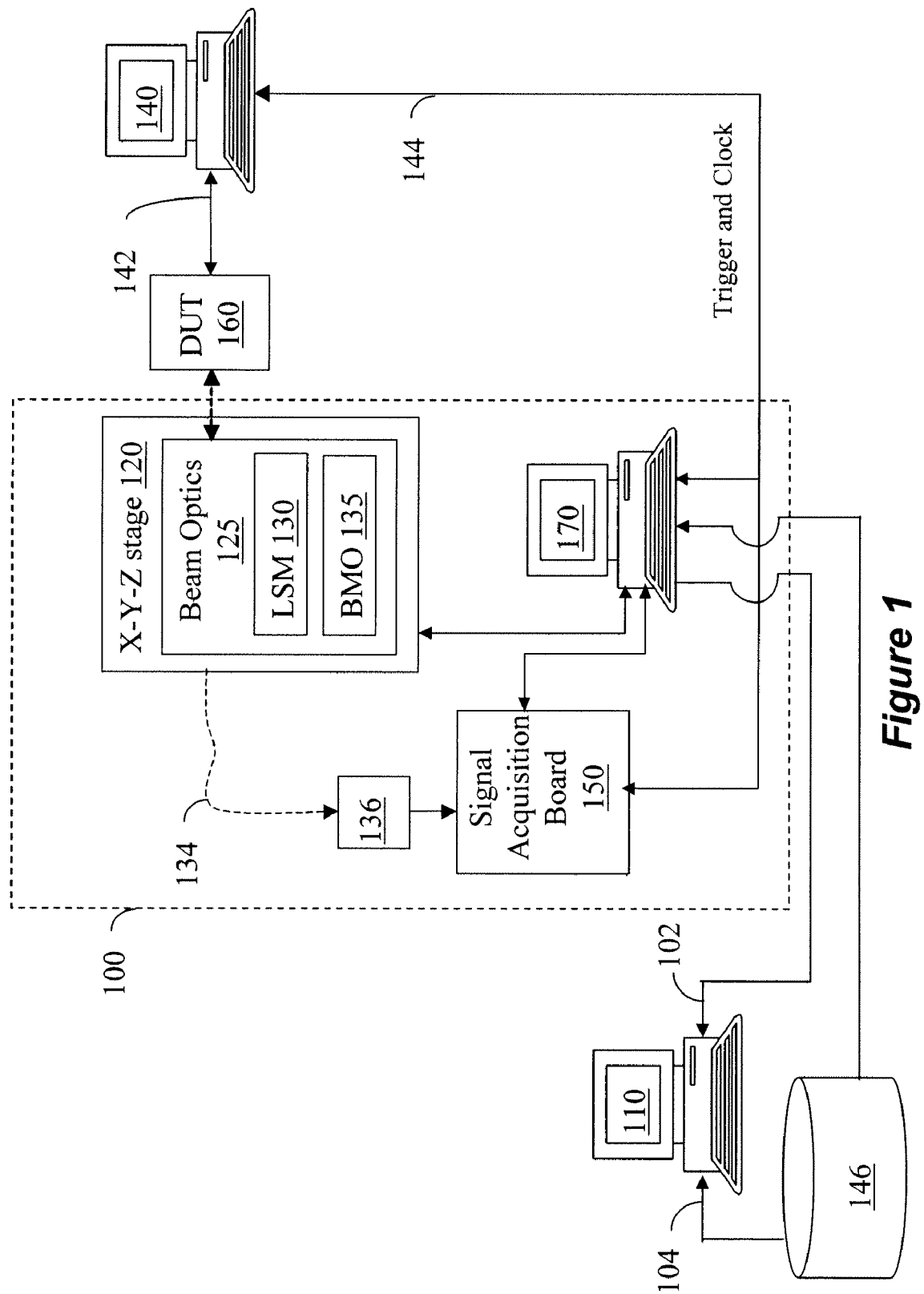
FIG. 1 is a schematic diagram illustrating alternative embodiments for systems according to the invention.

Table 4 illustrates an example of a tabulated display;

Table 5 illustrates an example where the weighted results are referred to as pooled;

Table 6 illustrates an example of a decision table;

Table 7 illustrates an example of tabulating a run on the entire area shown in FIG. 1.

DETAILED DESCRIPTION

Various embodiments of the invention provide methods and systems for identifying potential defective devices in an IC, by measuring/calculating the intensity of photo emission from the devices. Notably, in the prior art photon emission was observed manually to make a determination of emission/ no emission and compare the determination to the expected result. If a particular device is expected to emit under certain logical state and no emission is observed, the device was said to be defective. While such an analysis is beneficial to identify faulty devices having "killer" defects, i.e., defects preventing the device from functioning at all, it fails to detect malfunctioning devices having "soft" defects, i.e., cases where the device functions, but improperly, e.g., assumes the requisite logical state but in an irregular manner. For example, the threshold for tunneling is unacceptably low. The subject invention enables detection of both "soft" defects and "killer" defects.

In the first part of the following description the inventive method and system will be described for the cases where the emission can be resolved optically, i.e., it is possible to identify the device corresponding to each observed emission. However, for advanced devices having very small critical dimensions and very dense layout, optical means may not provide the resolution necessary to identify each emitting device. Various other embodiments of the invention provide methods and systems for resolving light emission from closely spaced transistors. The embodiments described enable resolution beyond what is possible with optical systems. That is, the optical system's resolution is limited by the wavelength of the light used to image the transistors, which, in semiconductor devices, is limited to infrared light due to the silicon's optical transmission characteristics. Various embodiments described utilize point spread function of the optical system to resolve the emission. The point spread function emulates the emission as a combination of point emitters, based on the linearity property of the light. Once the emission is resolved, the results can be used to identify defective devices.

FIG. 1 is a schematic diagram illustrating an embodiments for systems according to the invention. In FIG. 1, DUT (Device Under Test, e.g., an IC) 160 is undergoing testing by, for example, receiving test vectors 142 from tester 140, such as an ATE (Automated Testing Equipment or Automated Testing and Evaluation). Alternatively, the DUT may be provided with simple power-on signal or simple clock cycle signal. The DUT may be mounted onto optical tester 100, such as an IREM or time resolved IREM, e.g., EmiScope® available from Credence Systems of Fremont, Calif. Generally the optical tester 100 would include an x-y-z stage 120 for navigation over the DUT, a beam manipulation optics, BMO 135, consisting various optical elements, such as lenses and/or mirrors, and scanning mechanism, such as a laser scanning microscope 130. The elements are generic and not pertinent to the embodiments of the invention.

By the use of the above noted testing elements, photon emission is collected from various areas of the DUT by, e.g., fiber optics 134, and is sensed by photon sensor 136, such as an avalanche photodiode (APD), a low light camera, etc. Of course, other elements or arrangements may be used for collecting the emission. A signal acquisition board 150 may be coupled to the sensor to receive and condition the signal of the sensor 136. The signal is then applied to a processor 170, such as a specifically programmed PC. As shown, the processor 170 may also be used to control the various elements of the optical tester 100. Additionally, trigger and clock signal may be provided from the tester 140 to the signal acquisition board 150 and/or the processor 170.

Figure 2:
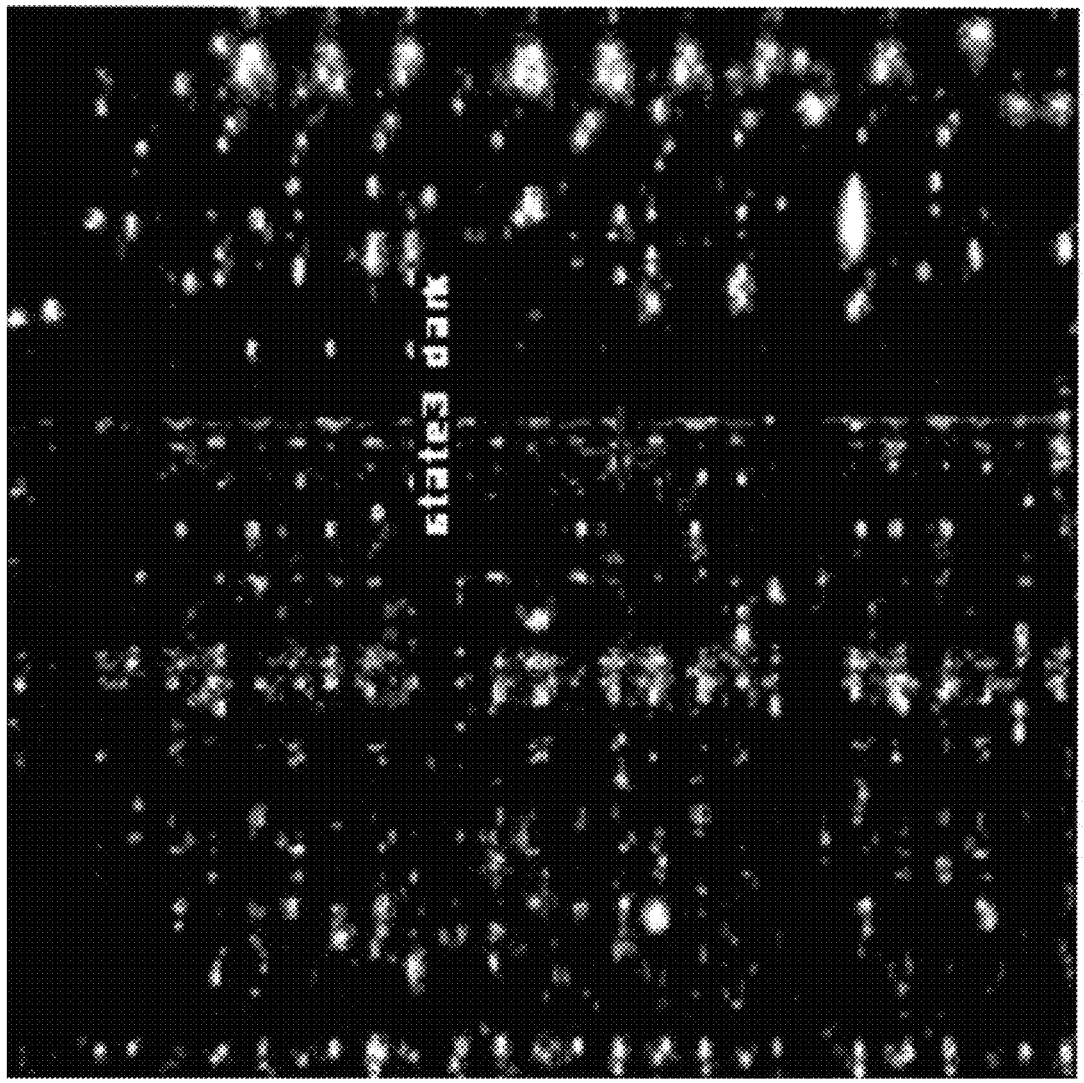
FIG. 2 is an emission image from an area of interest of a DUT.

FIG. 2 depicts an emission image obtained using the optical system shown in FIG. 1. The particular image of FIG. 2 is of a selected area of a DUT. The image may be displayed on the monitor of processor 170 using, e.g. image editing software as described in the above cited Bockelman et al., publication. However, as can be easily seen, it is very difficult to decipher which device corresponds to which emission. Moreover, projecting the layout over the image and manually determining which device is in the proper state is tedious and difficult to perform, as the emissions many times overlap. Also, such an investigation may only help in identifying inoperative devices, but fails to detect devices that operate, but not to the required performance parameters.

To provide improved detection ability, according to embodiments of the subject invention, the emission intensity from each device is determined. The emission intensity determination may be done in any conventional measurement and/or calculation manner, so long as consistency is maintained. Consequently, the terms intensity measurement and intensity calculation may be used interchangeably herein. Some specific examples of calculating emission intensities are provided further below. While the intensity calculation examples shown below are especially beneficial in circumstances where the system cannot resolve the emission optically, they can be employed just as well under circumstances where the emission can be optically resolved.

Figure 3:
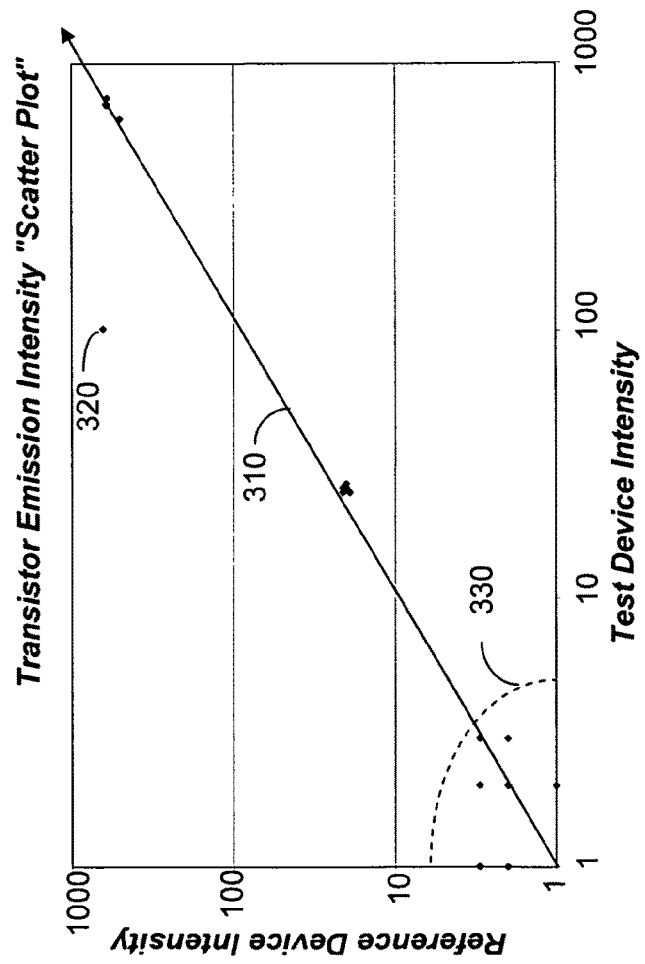
FIG. 3 is a plot according to an embodiment of the invention.

Emission intensities are also determined for corresponding devices of a reference IC. This can be done using an IC known to operate properly, a functional average of intensities from several IC's, using simulation, etc. The determined intensities of the DUT are then plotted against the calculated intensities of a reference device. An example is shown in FIG. 3. Specifically, in FIG. 3 the x-axis corresponds to the intensities of the devices of the DUT, while the Y-axis corresponds to the intensities of corresponding devices from a reference. Each point on the plot represents an intensity value for a device of the DUT with respect to its corresponding reference value. As can be seen, the values generally fall on a straight line 310. Notably, even if the DUT overall performance does not match that of the reference, the difference would mostly effect the slope, but the relationship would still be linear, at least to a first degree.

In FIG. 3, an area bounded by broken line 330 marks low intensities where the intensity value is very close to the noise level. Therefore, it is recommended to ignore these values when determining the linear relationship represented by line 310. From the plot of FIG. 3, it is easily recognizable that point 320 clearly deviates from the linear relationship 310. From the intensity value it is also clear that the device functions, i.e., the reference provides an indication that photon emission is expected from this device and, indeed, the plot shows that emission was detected from this device. However, the calculated intensity of the emission does not match the intensity expected from the linear relationship 310. Therefore, while this device seems to assume the proper logical state, it potentially has a "soft" defect as its performance does not match the expected performance. Consequently, further investigation of the performance of the device is needed.

The plot shown in FIG. 3 can be displayed on the monitor for the user to enable easy identification of potential defective devices. Alternatively, or additionally, the controller 170 may perform the calculations internally and simply provide a list of suspect devices requiring further investigation. For example, once the intensity values are determined for the DUT, the controller 170 can perform curve fit so as to find the linear relationship 310. Then the controller 170 may calculate acceptable deviation from the linear relationship, or the acceptable deviation may be input manually by the user. As explained above, the lower range of intensities may be ignored to avoid including noise. Once the linear relationship and the maximum allowable deviation have been determined, controller 170 then checks each entry whether it deviates from the linear relationship beyond the maximum allowable deviation. If so, the controller 170 adds that device to the list of suspect devices.

Figure 4:
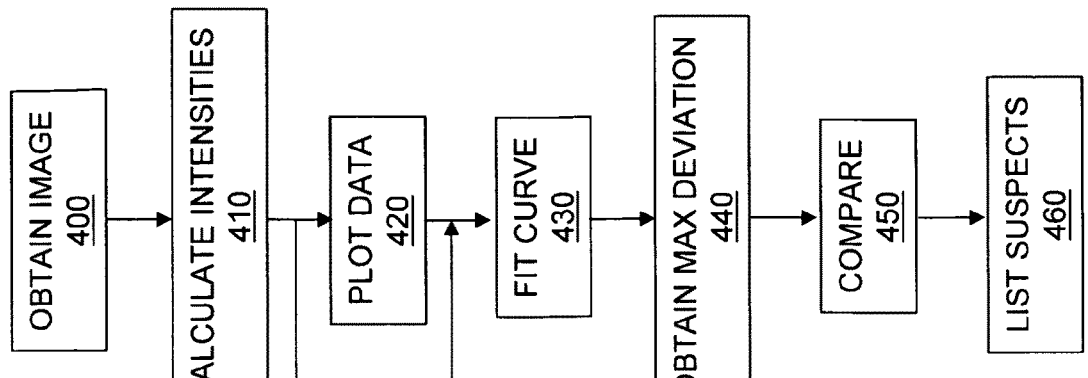
FIG. 4 is a flow chart illustrating an embodiment of the invention.

An example of a process according to an embodiment of the invention is shown in FIG. 4. In Step 400 an image of the area of interest is obtained. In Step 410 the intensities of the emissions at each site is determined. Then the intensities may be plotted against the reference intensities at Step 420. This step is optional, as shown by the by-pass arrow 415. At Step 430 a curve fit calculation is performed to obtain a linear relationship between the calculated and reference intensities. At Step 440 maximum deviation is obtained, either by calculation, such as standard deviation calculation, or by manual entry of the user. At Step 450 each data point's distance to the linear relationship is compared against the maximum allowable deviation. Any data point that surpasses the allowable value is added to the suspect list, which is provided to the user at Step 460.

While the explanation provided above relates to an "integrated" solution, in that the analysis of the image and determining suspect devices is done by the controller 170 of the imaging system 100, it should be apparent that these operations may be performed by a "stand alone" system. For example, a general computer, such as PC 110, may be specifically programmed to perform the investigative operations after receiving the image from controller 170 via line 102. Line 102 represent any manner of transferring the image from the system 100 to the stand alone system 110, such as, but not limited to, LAN, WAN, the Internet, using recordable storage media such as CDROM or Flash Memory, etc.

Regardless of whether the system is integrated or stand alone, The CAD layout may be used to determine the location of emission. The system, whether 110 or controller 170, obtains the CAD layout of the DUT from the CAD database 146, via CAD input 104. For example, the CAD layout information may include a LEF file (Library Exchange Format) which includes the device's coordinates within each cell, whether it is an N-channel or a P-channel and/or whether detected emission corresponds to a logical "0" or logical "1".

According to another embodiment of the invention, once the intensities have been determined, they are compared to reference intensities and the deviation is investigated. An example is shown in Table 1 and referred to as analog mode. Table 1 includes a cell name column, in which each cell under investigation is listed by its name in the database, e.g., LEF file. The next column is transistor name, which may also be obtained from the LEF file. The next column is Test Device Intensity, in which the calculated intensity of each transistor is tabulated. The next column is a Reference Device Intensity, in which the corresponding reference intensities are tabulated. These may be obtained from an IC known to function properly, from a collection of IC's, from simulation, etc. The last column lists the correlation of the calculated intensity to the reference. In the particular example of Table 1, File-Input B of Transistor N1 deviates by a very large margin. This margin most probably indicates a hard failure, i.e., failure to assume the correct logic state. On the other hand, File-Control C of Transistor N2 shows 75% correlation. Such deviation may signify a soft defect. In this particular case, the reference and calculated intensities are in the noise level, so in this case this value should probably be ignored. Nevertheless, the example is still valid for cases where the intensities are above the noise level, yet the deviation is somewhat below a given threshold for proper functioning, but not so low as to signify hard failure. Therefore, by setting two threshold values, one may easily identify soft and hard defects.

Figure 5:
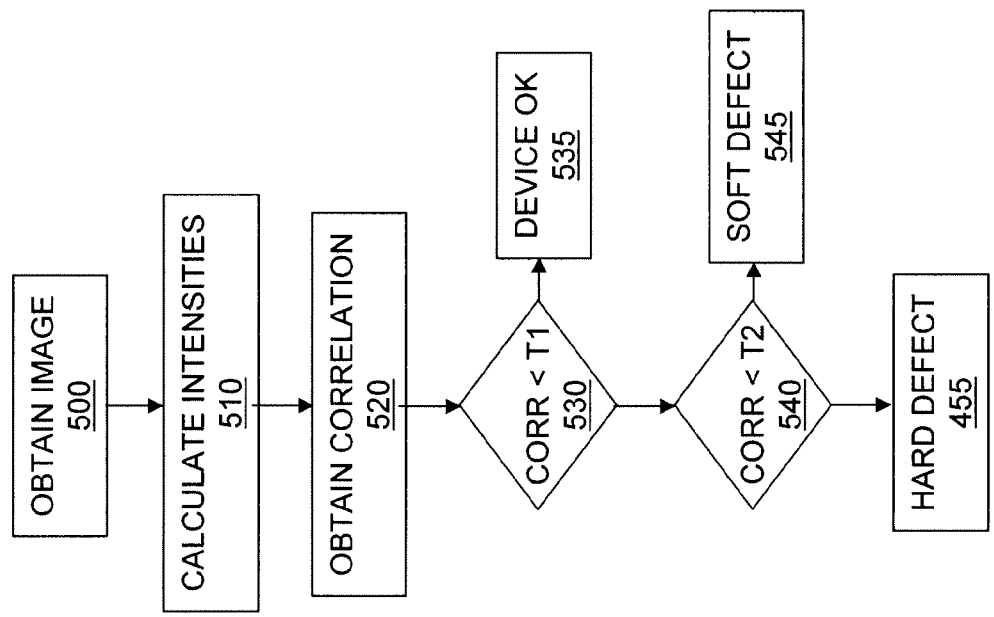
FIG. 5 is a flow chart illustrating another embodiment of the invention.

A process according to an embodiment of the invention is illustrated in FIG. 5. At Step 500 an image of the area of interest is obtained. At Step 510 the emission intensities of the devices of interest are calculated. At Step 520 the correlations to the references are obtained. At Step 530 each correlation is compared to a first threshold. If the correlation is above the first threshold, e.g., above 80%, the device is indicated to be properly functioning at Step 535. On the other hand, if the correlation is below the first threshold, in Step 540 the correlation is compared to a second threshold. If the correlation is above the second threshold, e.g., above 20%, the device is listed as suspect for soft defect as Step 545. On the other hand, if the correlation is below the second threshold, the device is listed as suspect for hard defect at Step 455.

According to a further embodiment of the invention, the calculated intensity is converted to a logical state for each device. This is illustrated in Table 2 and referred to as digital mode. Table 2 includes Cell Name column, in which the name of each cell of interest is tabulated. The next column is Test Device, in which the calculated logic state is tabulated. The logic state is obtained by reference to the calculated intensity and the Lef files wherein it is listed whether photon emission signifies logic state "1" or "0". The state is then compared either to a reference device or to a theoretical value. As can be seen, in this particular example the system identified Register B3 as potentially faulty.

Figure 6:
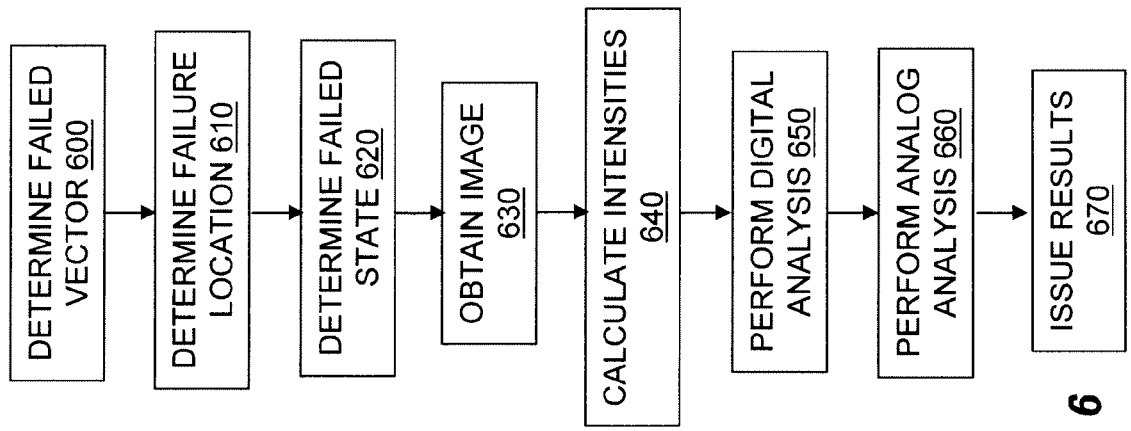
FIG. 6 is a flow chart illustrating yet another embodiment of the invention.

FIG. 6 illustrate a process according to an embodiment of the invention. In Step 600, a tester, e.g., an ATE is interrogated to obtain failed vectors. In Steps 610 and 620, a fault diagnostics software (e.g., Yield Assist™ Available from Mentor Graphics™ of Wilsonville, Oreg., or Encounter™ available from Cadence™, of San Jose, Calif.), is interrogated to ascertain the scan chain location and to identify the failure state. In Step 630 the optical system is navigated to the failure location to obtain an image. The optical system may obtain a background image and an emission image of the emission during the failure state. At Step 640 the intensities for each emission is calculated. At Step 650 digital analysis may be performed, i.e., the calculated emission is converted to a logical "1" or "0" and the value is compared to the expected logical value. In Step 660 an analogue analysis is performed. That is, the calculated intensity is either plotted or compared to reference values, as discussed above. In Step 670 the list of suspect devices is provided to the user.

Figure 7:
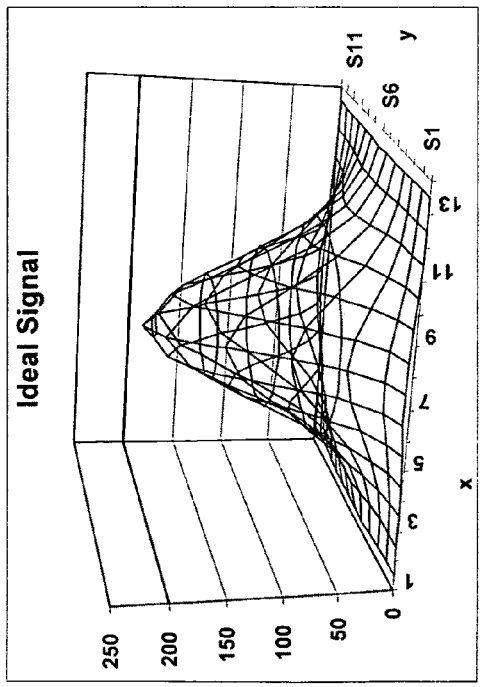
FIG. 7 is a 3-d plot illustrating an ideal point spread function emission of a single point emitter, as simulated in developing the subject invention.
Figure 8:
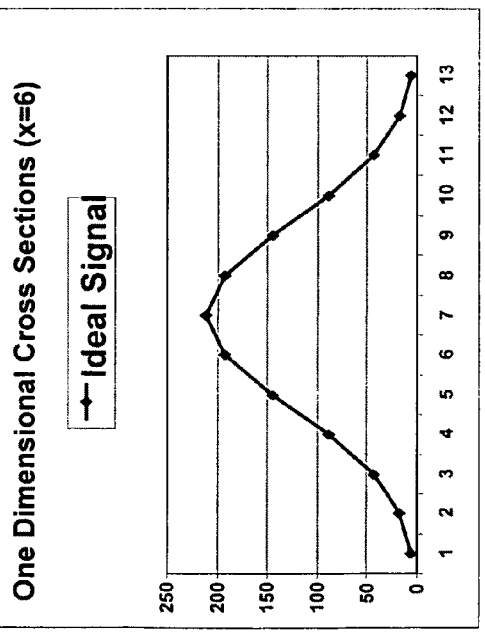
FIG. 8 is a cross section of the plot of FIG. 7.

Attention is now shifted to embodiments of the invention enabling calculation of intensities even when the optical resolution is insufficient to resolve the emitting devices. FIG. 7 is a 3-d plot illustrating an ideal point spread function emission of a single point emitter. FIG. 8 is a cross section of the plot of FIG. 7. That is, for an optical system without further electrical aberrations and system noise, the signal obtained from a point emitter should appear as shown in FIGS. 7 and 8.

Figure 10:
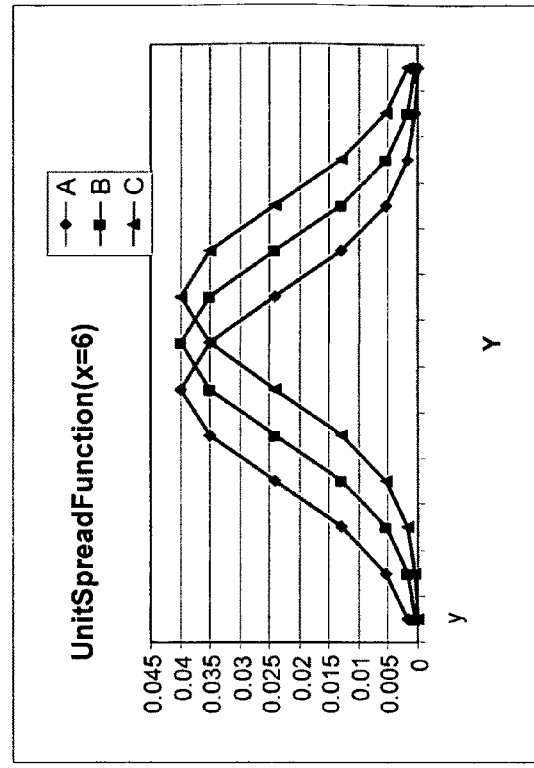
FIG. 10 is a plot of the point spread function of the three transistors A, B and C depicted in FIG. 9, simulated according to an embodiment of the invention.

FIG. 9 is an illustration of a part of a semiconductor chip, having three transistors, A, B, and C, closely spaced thereupon. In operation, these transistors may assume any of the states illustrated in Table 3. For example, in state 1 none of the transistors emits light, while is state 2 only transistor A emits light. FIG. 10 is a plot of the point spread function of the three transistors A, B and C depicted in FIG. 9. Incidentally, throughout this description, depending on the context, references to a transistor being "on" or "off" may mean that it is emitting or not emitting light, and not necessarily being in the electrically conductive or non-conductive state. In fact, as discussed above, static emission may result when the transistor is electrically non-conductive. Moreover, the use of the terms "on" or "emitting" herein is intended to include light reflection and/or modulation from the transistor.

Figure 12:
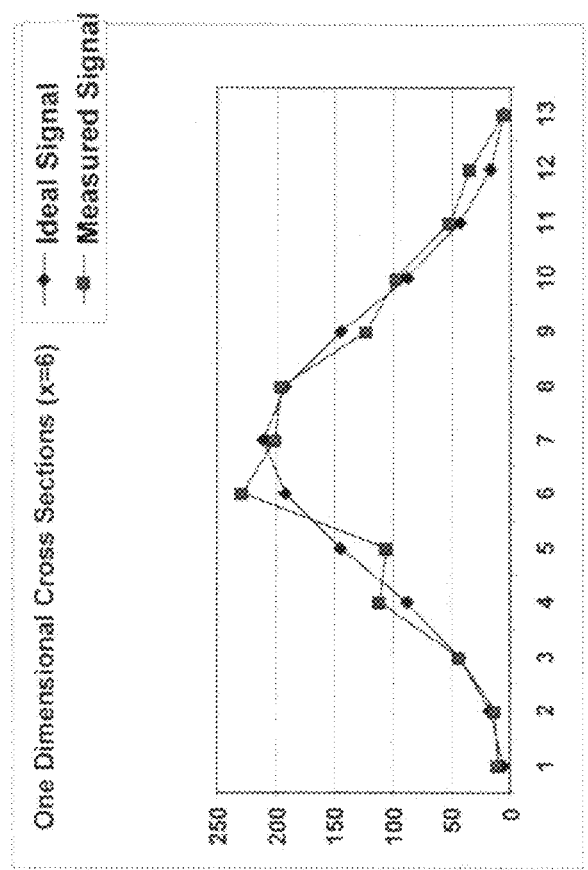
FIG. 12 is a plot of a cross section of the measured signal overlaid on an ideal point spread function plot.
Figure 11:
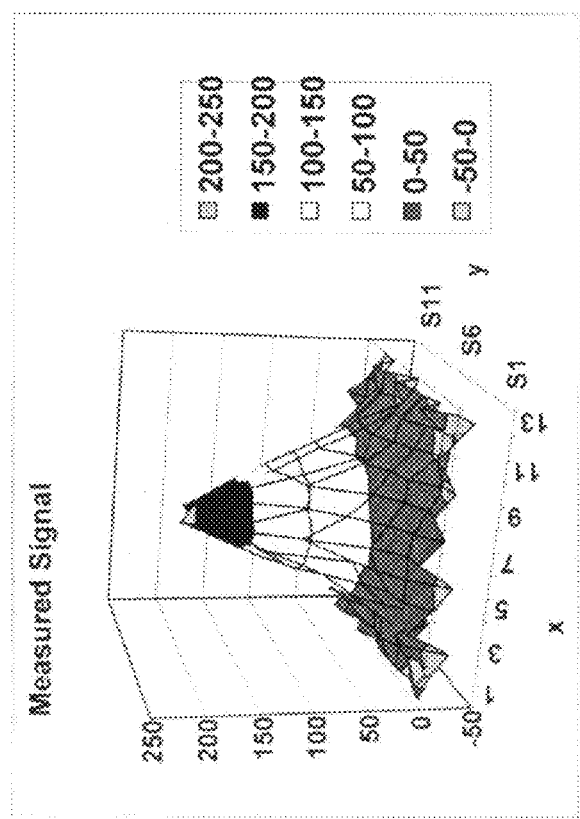
FIG. 11 is a 3-d plot of a measured signal from a location having three transistors arranged as illustrated in FIG. 9, as simulated in developing the subject invention, according to an embodiment of the invention.

FIG. 11 is a 3-d plot of a measured signal from a location having three transistors arranged as illustrated in FIG. 9. For this illustration, the signal is actually a simulated signal with a random number generator used for introducing noise into the signal. As can be seen, the signal differs from the ideal signal of a point emitter, mainly due to noise in the system. Therefore, when the transistors are closely spaced, it is hard to resolve which transistor emits light. FIG. 12 is a plot of a cross section of the measured signal overlaid on an idea point spread function plot. This plot also illustrates the difficulty in resolving the emission.

Figure 13:
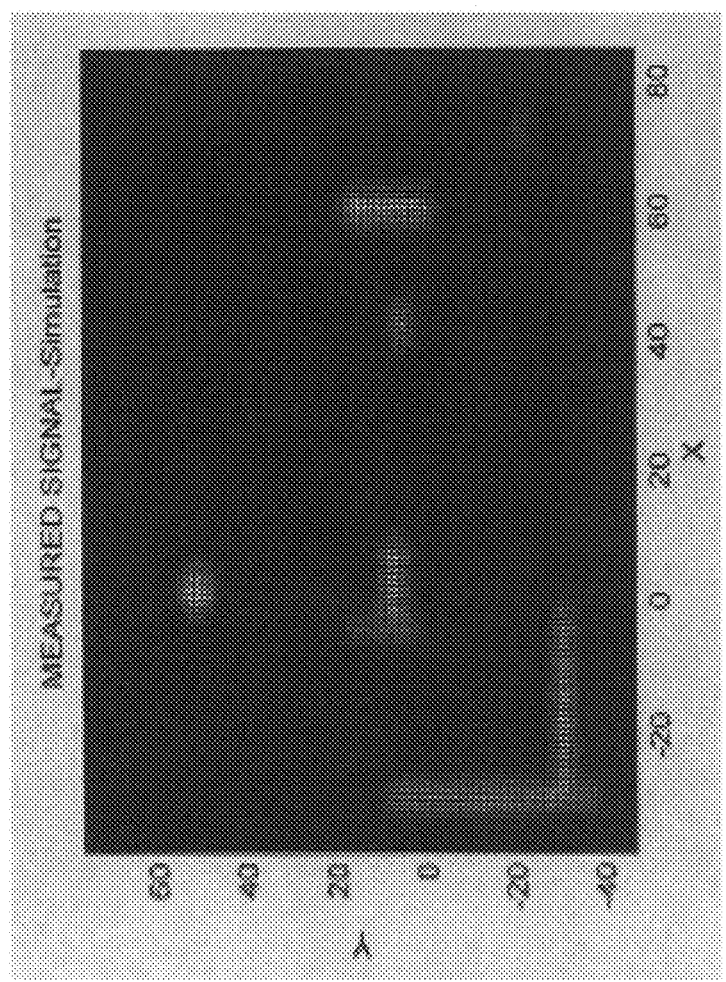
FIG. 13 is measured signal of emission from multiple transistors in an area of a semiconductor chip, as simulated in developing the subject invention.
Figure 14:
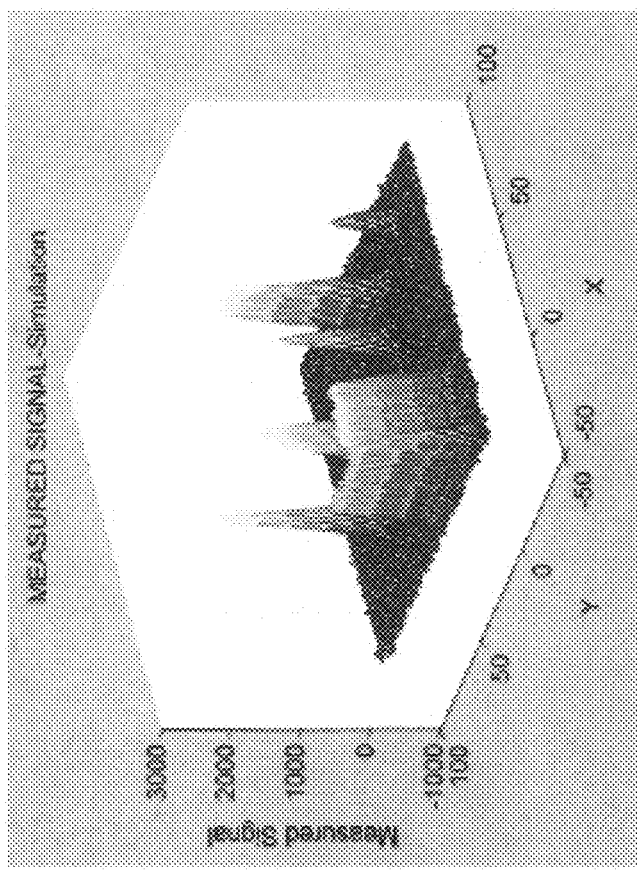
FIG. 14 is a 3-d plot of the signal measured in FIG. 13.

FIG. 13 is measured signal of emission from multiple transistors in an area of a semiconductor chip, while FIG. 14 is a 3-d plot of the signal measured in FIG. 13. For this particular example, the signal has been simulated, but it faithfully replicates the appearance of a real measured signal. The following provides examples of how such a signal can be resolved.

Figures 15, 16:
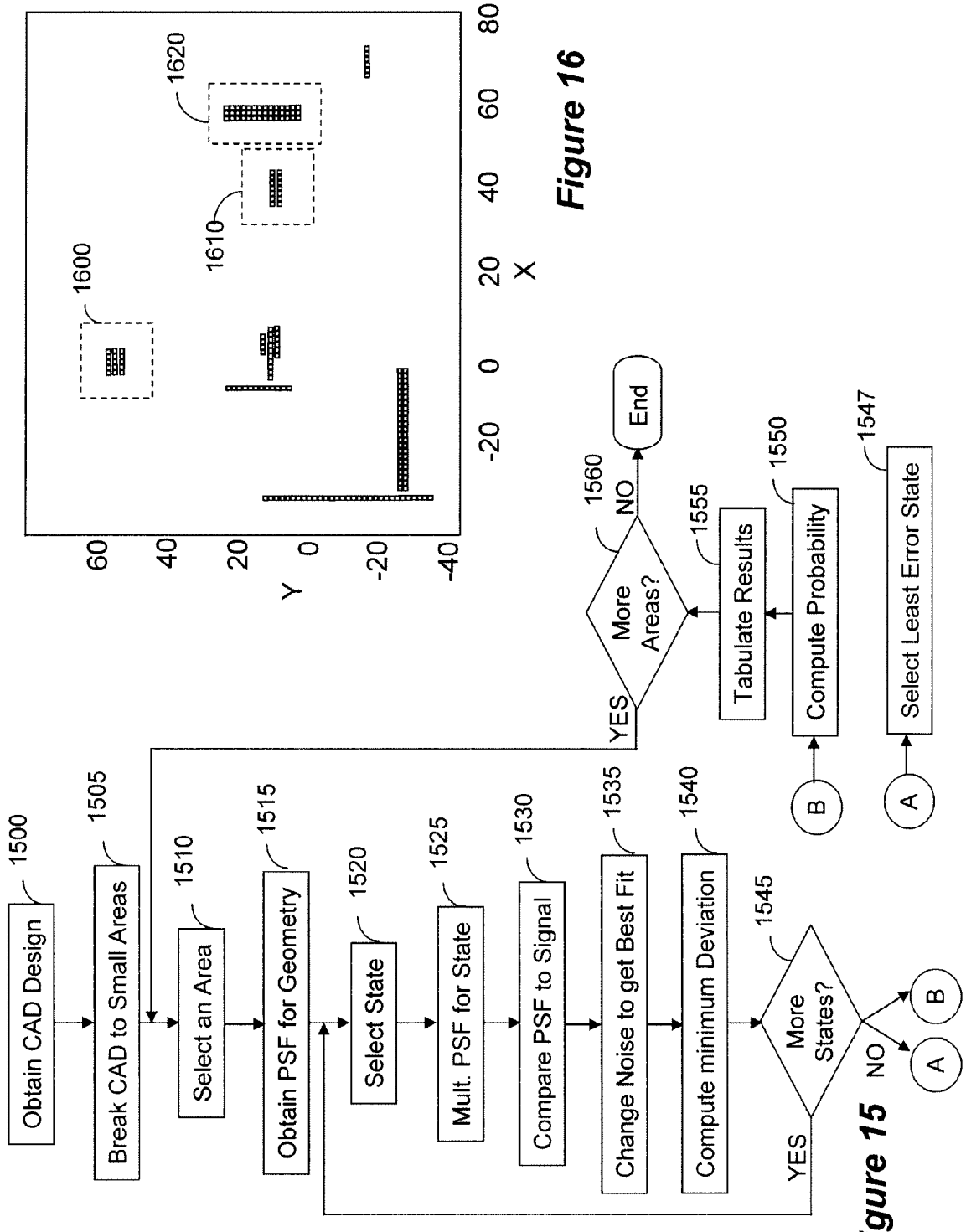
FIG. 15 depicts a flow chart for a process to resolve the emission according to an embodiment of the invention.
FIG. 16 depicts a CAD layout design for the chip area of the image of FIG. 13.

FIG. 15 depicts a flow chart for a process to resolve the emission according to an embodiment of the invention. The process begins at Step 1500 where the CAD design of the area under investigation is obtained. The CAD design for the chip area of FIG. 13 is depicted in FIG. 16, where the layout of various devices is shown with respect to an arbitrary (x,y) Cartesian coordinates. When, as in this example, the area of the chip includes clusters of closely spaced transistors, in Step 1505 the area is broken to smaller, more manageable areas along these clusters, as illustrated by broken-line rectangles 1600, 1610, and 1620. An area for testing is selected in Step 1510 and for each selected area the transistors are identified and the list of possible states is assembled. Notably, by breaking the area into smaller clusters, the number of states that the system needs to consider in the calculations is reduced. The maximum size of the clusters, i.e., the maximum number of transistors within a cluster, can be determined according to the processing power of the system.

At Step 1515 the point spread function (PSF) is calculated for the geometry of the devices in the area selected in Step 1510. Alternatively, the PSF for all of the various device geometries can be calculated beforehand so as to build a PSF library. In such a case, at Step 1515 a proper PSF corresponding to the geometry of the area selected in Step 1510 is selected in Step 1515 from the library. At Step 1520 a state is selected and at Step 1525 the PSF is multiplied by the selected state. For example, if the area selected has three transistors aligned in a single line, as sown in the example of FIG. 9, for the first state shown in Table 'the PSF will be multiplied by (0,0,0), for the second state by (1,0,0), etc.

The resulting calculated PSF is then compared to the measured signal in Step 1530. At Step 1535 a "noise" is introduced to the PSF so as to obtain the best fit to the measured signal. This step can be performed using a formula or by iteratively searching for a multiplier that would result in the best fit between the PSF of the selected state and the actually measured signal. In essence, the goal is to minimize the error between the curve of the PSF for the selected state and the measured signal. One way to do this iteratively is to vary the intensity of each transistor that is defined to be "on," i.e., emitting, for the selected state until the calculated PSF best matches the measured signal.

When the best fit is obtained, the minimum deviation is calculated at Step 1540. For this step, any known method for calculating the deviation between the two curves may be used. For example, the known least square or ordinary least square method may be used to obtain the best curve fit and the minimum residual set as the minimum deviation. The least square method assumes that errors are randomly distributed. However, according to one embodiment of the invention, the noise level is assumed not to be randomly distributed, but rather correlated to the intensity value itself. For example, the error of each measured data point may be assumed to equal to the square root of the measured data point, i.e., the intensity I at each point may equal $I +/- \sqrt{I}$. Therefore, according to one embodiment, the Chi Square analysis is used instead. Generally, the Chi Square used in this embodiment is in the form $(I_M-I_E)^2/N$, where $I_M$ is the measured intensity and $I_E$ is the expected intensity (i.e., PSF), and N is the noise squared ($N=I_E+n^2$, where n is the sensing noise). To obtain the deviation, referred to in Table 4 as tChiSq, a summation is performed over the number of sampled points:

$$tChiSq=\Sigma(I_M-I_E)^2/N$$

As can be understood, the number of sampled points can be varied to provide fine or coarse approximation, as required by the particular application.

At Step 1545 it is determined whether there are more states to calculate and, if so, the process circularly reverts to Step 1520. If all of the states have been calculated, according to one embodiment the process proceeds according to process A, wherein at Step 1547 the state having the smallest error is selected as the correct state. The intensity calculated for each transistor for the selected state is provided as an indication of which transistor emits light. According to another embodiment, the process proceeds according to process B, which starts at Step 1550, where the relative probability of each state is calculated. Of course, both processes A and B can be implemented as a cross check on the final selection.

The relative probability of each state may be calculated from the resulting deviation obtained in Step 1540. Various known statistical methods may be used to calculate the relative probability. According to one embodiment, the Chi-Square distribution is used, while in another an F-distribution is used. Of course, both may be used, as shown in Table 4 wherein the Chi-Square distribution is noted as tChiDist and the F-Distribution is noted as tFdist. The results are tabulated in Step 1555 and may be displayed for the user to determine which state is most likely to generate the measured signal. An example of a tabulated display is shown in Table 4.

It should be noticed that at this step, non-physical values may be omitted from the calculations. For example, if during the calculation of Step 1540 the best curve fit is obtained when an intensity of any transistor is set to a negative value, that particular state may be removed as non-physical, i.e., the transistors are only emitters and not absorbers.

The example shown in Table 4 is for the three-transistor layout as shown in FIG. 9, with the possible states illustrated in Table 3. For each state the intensity values have been changed until the best fit to the measured signal has been achieved. Then the "best fit" value of the intensities, tA, tB, and tC, for each transistor was recorded for each selected state. The minimum deviation in this example is shown as tChiSq. As can be seen in this example, the worst deviation is for the first state, as we compare a PSF of no emission with a measured signal showing emission. On the other hand, the best deviation is shown for both states (101) and (111). Moreover, the Chi-squared distribution is similar for both states (0.26 and 0.25, respectively). Therefore, at first glance it may seem that both states may present an equally valid solution. However, for state (111) the "best fit" intensity of tB was set to a negative value (−755.47). This is a non-physical solution that may be removed during the probability calculation as noted above. Additionally, the F-Distribution strongly favors state (101). Therefore, it stands to reason that the correct solution is state (101).

Taking a step back, the resulted statistics shown in Table 4 actually make sense from the physical point of view. That is, due to the linearity property, two closely spaced emitters would produce a signal that would add up to generally look like a widened PSF curve of a single emitted centrally situated between the two emitters. Consequently, at certain resolution both states (101) and (111) may seem to fit, as both would generate a widened PSF curve of a single emitter. However, at closer resolution, the resulting signal of the two emitters will have a dip at its center (i.e., between the two peaks of the two individual emitters). This is why in order to fit state (111) the intensity of the middle transistor had to be adjusted to a negative number, i.e., to generate the dip in the middle. This fact increases the confidence that the actual state is indeed (101). Therefore, according to another embodiment, negative intensity values are not removed, but rather used to confirm or increase the confidence in the finally selected solution.

According to a further embodiment of the invention, further processing is performed to obtain increased confidence in the selected state. According to this embodiment, once the processing of FIG. 15 is completed for a selected area, a weighted sum is obtained for the solution, taking into account the resulting probability of each state. An example is illustrated in Table 5, where the weighted results are referred to as pooled. For example, the intensities for transistor tA are multiplied by the probability of each state and then summed. As can be seen in Table 5, after this operation the pooled intensities of transistors A and C are much higher than that of transistor B. This supports the conclusion that the correct state is (101).

Figure 17:
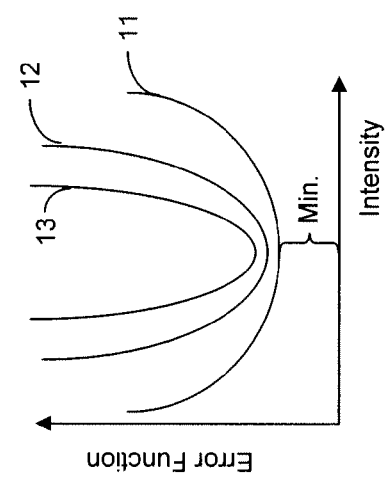
FIG. 17 provides an illustration of three error functions plotted against the intensity, for explaining the sigma feature of the invention.

According to a further embodiment of the invention, when the best fit PSF curve is obtained, a value is calculated to indicate the strength of this solution. This value is called herein sigma and it is shown in Tables 4 and 5 as tSigA, tSigB, and tSigC. FIG. 17 provides an illustration, wherein three error functions 11, 12, and 13, are plotted against the intensity. The minima indicate the least error, i.e., the best fit. However, as can be seen, the curve of plot 11 is flatter than that of curve 13. Therefore, the least error solution selected from curve 13 is of higher certainty than that obtained from curve 11. This measure is reflected in the sigma value shown in Tables 4 and 5. In these tables, the larger the sigma value is, the lower the confidence. Also, when the sigma value approaches the intensity value, it indicates high uncertainty in the intensity value. Moreover, when the sigma value exceeds the intensity value, the intensity value at that state cannot be relied upon. For example, for the state (111) in Table 4, the sigma value of transistor B is higher than its intensity value for that state. This confirms that state (111) is not probable. A similar indication can be seen in the pooled values, i.e., the sigma value for transistor B is higher than the weighted intensity of transistor B, indicating that the intensity value of transistor B is unreliable.

According to another embodiment of the invention, a decision table is constructed and presented to the user. An example of such a table is depicted in Table 6. In table 6, the weighted intensity and sigma of each transistor are shown. Additionally, for each transistor the cumulative probability that the transistor is on is calculate and presented in the table. This can be done, e.g., by adding the on probability in the F-Distribution obtained in table 4. As can be seen from Table 6, the probability that transistor A is on is very high and its predicted intensity is high and much larger than its sigma. Similar results can be seen for transistor C. Therefore, the system may issue a decision, called blended verdict, that transistors A and C are on. On the other hand, while the cumulative probability that transistor B is on is not negligible, its sigma is much higher than its intensity. Therefore, it is highly unlikely that transistor B is on and the system may issue a decision that it is off. If one wishes to be conservative, the system may issue an undecided verdict as illustrated in Table 6. However, even if it is undecided, if one takes transistor B to be on, it is clear that its intensity is very faint as compared to A and C. As noted earlier, the measured intensity values for these examples were actually obtained by simulation, using a random number generator for generating the noise. The "noise free" intensity of the simulation is shown in Table 6 under "Actual Value." As can be seen, the weighted intensities closely match the actual intensities used for the simulation.

The blended verdict can be tailored to particular situations and to provide different "levels of comfort." One may take a conservative approach and force a decision only when the probabilities are very high, with very low sigma and clear decision. Conversely, one may chose a relaxed criteria for the blended verdict. According to one example, for a particular transistor the verdict is declared only if the probability of the transistor being in the "on" state is twice as the probability of it being in the "off" state. According to another example, the number of states having a probability that is at least half the probability of the most likely state is counted. If the number is larger than the number of transistors in the tested area, no decision is issued.

The process of FIG. 15 was run on the entire area shown in FIG. 13 iteratively, using the random number generator to introduce noise. The results from one of the runs are tabulated in Table 7. Notably, the developed system is fully automated and performs the calculations discussed above to resolve emission from each cluster of transistors. In this particular run, the system automatically provided an ON/OFF decision for 17 out of the 22 transistors. As can be seen from Table 7, the system's estimated intensities closely match the simulated intensities for all of the transistors for which the system made an ON/OFF decision. In fact, even for transistors for which the system did not provide a decision, for four out of five transistors the intensities were very close to the simulated intensities.

As can be seen from the description so far, the methodology provides calculated intensities for each transistor, regardless of whether the transistors can be resolved optically. The calculated intensities may be then used to investigate soft and hard faults in the IC, as illustrated above. Moreover, by performing this analysis on several IC's and generating functional average of the intensities for each device, reference values may be obtained for use in testing other IC's. The functional average may be a weighted average, a list of medians, or any other functional averaging chosen.

Figure 18:
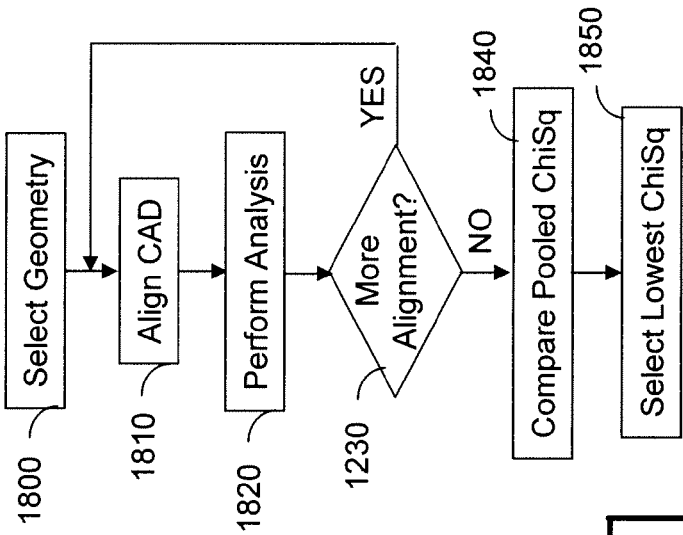
FIG. 18 depicts a flow chart for eliminating misregistration errors according to an embodiment of the invention.

According to another embodiment of the invention, the system also takes into account possible misregistration of the CAD layout to the device under test (DUT). FIG. 18 depicts a flow chart for eliminating misregistration errors according to an embodiment of the invention. According to this embodiment, once a geometry is selected at Step 1800 (corresponding to Step 1510 in FIG. 15), an iterative analysis is performed as follows. At Step 1810 a CAD layout alignment with respect to the DUT is chosen. Then the analysis as described with respect to FIG. 15 is performed at Step 1820 and the results are stored. At Step 1830 it is determined whether another alignment should be chosen. That is, the system is programmed to select a predetermined number of alignments of the CAD. This can be done by storing preset moves in the x and y direction so that in each iteration the CAD design is moved a predetermined amount in the x-direction, the y-direction, or both. If at Step 1830 it is determined that another alignment needs to be checked, the process circularly reverts to Step 1810. Otherwise, the process proceeds to Step 1840 where all of the calculated pooled Chi-Squared values are compared, and at Step 1850 the CAD alignment resulting in the lowest pooled Chi-squared value is selected as the proper alignment and the results from this alignment are used for resolving the emission.

Figure 19:
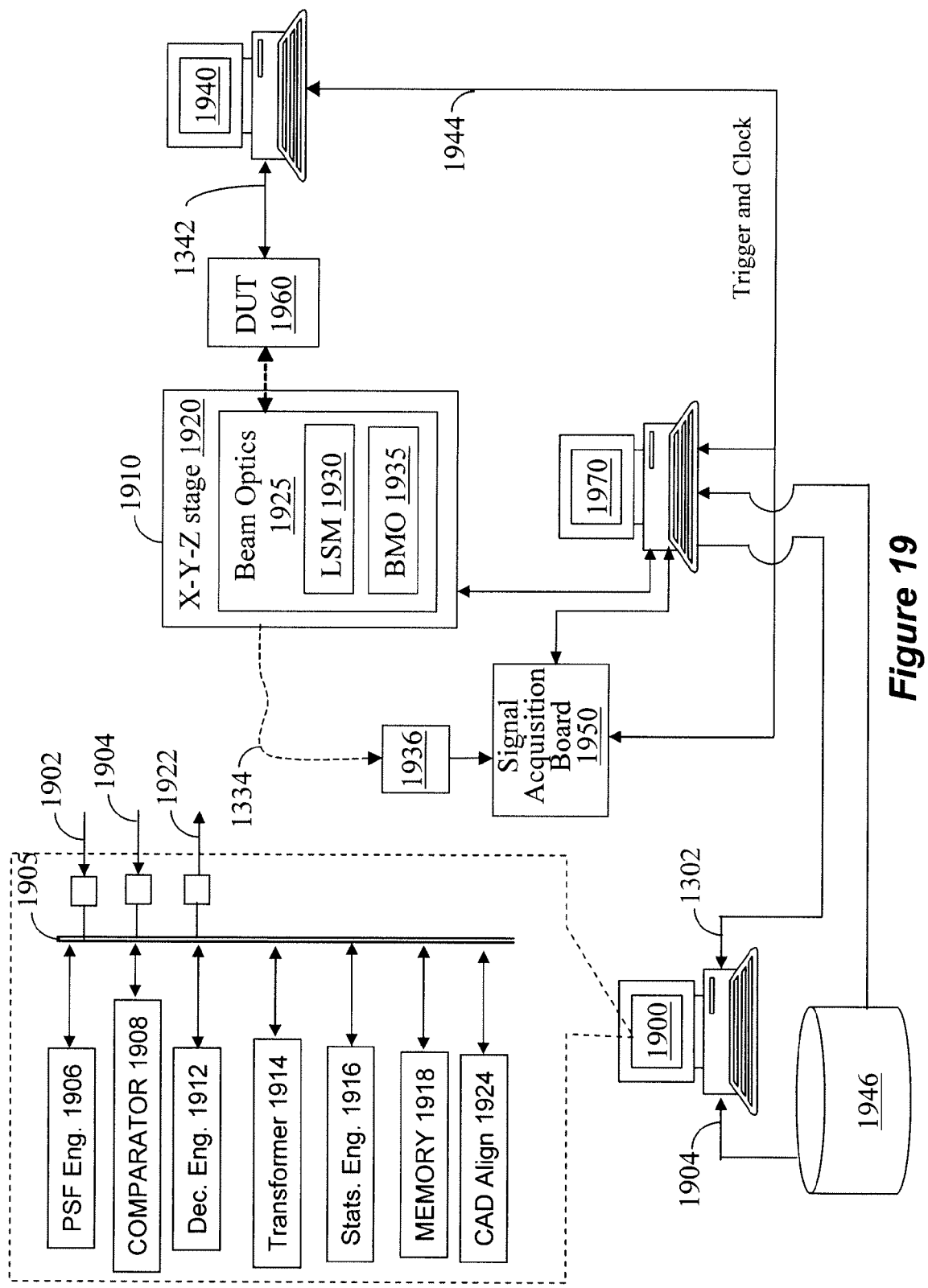
FIG. 19 is a schematic diagram illustrating alternative embodiments for systems according to the invention Table 1 illustrates an example of determined intensities compared to reference intensities.

FIG. 19 is a schematic diagram illustrating an embodiments for systems according to the invention. In FIG. 19, DUT 1960 is undergoing testing by, for example, receiving test vectors 1942 from tester 1940. The DUT may be placed on optical tester 1910, such as, e.g., EmiScope® or Ruby® available from DCG Systems of Fremont, Calif. Generally the optical tester 1910 would include an x-y-z stage 1920 for navigation over the DUT, a beam manipulation optics, BMO 1935, consisting various optical elements, such as lenses and/or mirrors, and scanning mechanism, such as a laser scanning microscope 1930. The elements are generic and not pertinent to the embodiments of the invention.

By the use of the above noted testing elements, light is collected from various areas of the DUT by, e.g., fiber optics 1934, and is sensed by light sensor 1936, such as an avalanche photodiode (APD), low light camera, etc. A signal acquisition board 1950 may be coupled to the sensor to receive and condition the signal of the sensor 1936. The signal is then applied to a processor 1970, such as a specifically programmed PC. As shown, the processor 1970 may also be used to control the various elements of the optical tester 1910. Additionally, trigger and clock signal may be provided from the tester 1940 to the signal acquisition board 1950 and/or the processor 1970.

According to one embodiment of the invention, the processing to resolve the emission detected by the optical tester 1910 is performed by a stand-alone system 1900, which may be implemented in the form of specially programmed general purpose computer, or specifically constructed hardware and/or software and/or firmware. The stand-alone system 1900 also performs the intensity evaluation to determine faulty and malfunctioning devices, as described above. The acquired and conditioned signal is sent from the processor 1970 to the optical signal input 1902 of the resolving system 1900. The system 1900 then obtains the CAD layout of the DUT from the CAD database 1946, via CAD input 1904. The system 1900 then follows any of the processes disclosed herein to resolve the detected emission. According to yet another embodiment, the system 1900 is constructed integrally to the processor 1970. In such a case, the CAD layout is provided from the CAD database 1940 to the processor 1970.

The callout in FIG. 19 illustrate an embodiment of the resolving system 1900, whether it being a stand-alone system or integrally to the processor 1970. Some or all of these elements may also be used for the intensity analysis to investigate faulty and malfunctioning devices. The system 1900 has a bus 1905, to which various elements are coupled to communicate and provide signals to other elements. The optical signal input 1902 and the CAD layout input 1904 are connected to the bus 1905 and provide the signal onto the bus. Also, an output 1922 provides the output of the various calculations and determinations to, e.g., a monitor, a printer, etc. To enable the processing as described herein, the system 1900 may include a point spread function generator 1906 that generates the point spread function of the transistors and the various selected states. A comparator 1908 compares the PSF from the PSF generator 1906 to the optical signal obtained from the input 1902. A decision engine 1912 receives the outcome of various calculations performed by the various elements of the system 1900 and provides an output for the resolving decision. A statistics engine 1916 performs the various statistical calculations, such as the Chi-Square, Chi-distribution, F-distribution, etc. ad provides the output to the decision engine 1912. A transformation engine 1914 operates on the PSF to seek the best fit to the optical signal. Additionally, a CAD aligner 1924 provides various CAD coordinates to align the CAD layout and iteratively calculate error for various CAD alignments until the smallest error is obtained, thereby selecting the best CAD alignment coordinates.

Memory 1918 may be used by the various elements to store data. Memory 1918 may include memory area for storing PSF library for various transistor geometries. Notably, according to aspects of the invention, the logic state for each transistor is determined (e.g., using the methods described above), and the state is automatically stored in memory 1918, together with the test vector operating during the imaging. The state can then be compared against stored reference values obtained, either from known good device or against other expected value, e.g., based on theoretical calculation or simulation. Alternatively, the states obtained for several devices can be used to set the proper state. As can be understood, any of the elements of system 1900 may be provided in the form of hardware, software, firmware, or any combination thereof. Moreover, it should be understood that all of the elements of system 1900 may be implemented by a single processor executing specifically designed software code.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the plasma chamber arts. It is intended that the specification and examples be considered as exemplary only, with a true scope and spirit of the invention being indicated by the following claims.

The invention claimed is:

1. A method for detecting defective transistors in integrated circuit (IC) using photon emission, comprising:
   obtaining an infrared emission microscopy image from an area of the IC;
   determining intensity values to provide determined intensity of emission from each transistor present in the area of the IC;
   obtaining reference intensity corresponding to each transistor;
   comparing each determined intensity to corresponding reference intensity.

2. The method of claim 1, wherein the step of comparing comprises plotting each determined intensity against its corresponding reference intensity.

3. The method of claim 2, further comprising calculating a linear relationship between all of the determined intensities and the reference intensities.

4. The method of claim 3, further comprising determining a maximum allowable deviation from the linear relationship.

5. The method of claim 4, further comprising:
   for each determined intensity, calculating deviation from the linear relationship and comparing the deviation to the maximum allowable deviation.

6. The method of claim 1, further comprising:
   for each determined intensity assigning a logical state of "one" or "zero".

7. The method of claim 6, further computing obtaining reference logical states and comparing the assigned logical states to the reference logical states.

8. The method of claim 1, further comprising:
   assigning a first threshold;
   for each transistor determining a difference between the determined intensity and the reference intensity;
   determining whether the difference is below the first threshold and, if so, designating the transistor as suspect inoperative transistor.

9. The method of claim 8, further comprising:
   assigning a second threshold;
   for each transistor having a difference above the first threshold, comparing the difference to the second threshold and, if the difference is below the second threshold, designating the transistor as operative but malfunctioning transistor.

10. The method of claim 1, wherein calculating intensity comprises:
    obtaining a CAD layout of the transistors present in the area of the IC;
    generating a spread function for the transistors from a point spread function (PSF) of the optical system;
    computing the intensity of discrete light emission of each transistor by comparing the spread function to light signal of the emission image.

11. The method of claim 10, further comprising:
    determining a plurality of state combinations, each combination comprising unique mixture of states of the transistors;
    for each of the plurality of state combinations:
      generating a combination spread function;
      comparing the combination spread function to the light signal to thereby obtain an error and discrete intensity of emission from each transistor;
    selecting the state combination having the smallest error as the true state combination;
    selecting the resulting intensities of states corresponding to the true state combination.

12. The method of claim 11, wherein comparing the combination spread function to the light signal further comprises performing a least square minimization operation on the combination spread function.

13. The method of claim 11, wherein comparing the combination spread function to the light signal further comprises performing a Chi-Square minimization operation on the combination spread function.

14. The method of claim 1, further comprising:
    determining logical state for each calculated intensity;
    storing the calculated state together with identity of a corresponding test vector.

15. The method of claim 14, further comprising comparing each logical state to a reference logical state.

16. A system for identifying malfunctioning and faulty transistors using IR photon emission collected from a device under test (DUT), comprising:
    a first input receiving image signal correlating to the IR photon emission collected from a selected area of the DUT;
    a processor receiving the image signal and determining emission intensity for each transistor within the selected area;
    a storage having reference intensities stored therein;
    a comparator comparing each of the determined emission intensities to a corresponding reference intensity;
    an output circuit outputting the comparison results.

17. The system of claim 16, wherein said output circuit comprises a monitor displaying a plot of each determined emission intensity against a corresponding reference intensity.

18. The system of claim 17, further comprising a second input receiving CAD layout of the DUT and wherein said storage further having expected logical state for each transistor stored therein.

19. The system of claim 18, wherein said processor further assigns a logical state to each determined intensity and compares the assigned logical state to the expected logical state.

20. The system of claim 16, further comprising a state mapping module receiving the emission intensity for each device and determining a logical state for each device, and further storing the logical state and a corresponding test vector in the storage.

21. The system of claim 20, wherein the comparator compares the logic state of each transistor to an expected logical state.

22. An optical tester for testing a semiconductor device under test (DUT), comprising:
   a collection optics for collecting infrared photon emission emitted from transistors within a selected area of the DUT;
   a sensor for sensing the photon emission from the collection optics and generating an emission signal;
   a processor receiving the emission signal and determining emission intensity for each transistor within the selected area;
   a logic state module determining a logic state for each transistor;
   a storage storing the logic state of each transistor together with a corresponding test vector.

23. The tester of claim 22, further comprising a state comparator comparing the logic state of each transistor to an expected logic state.

24. The tester of claim 23, further comprising:
   reference intensities;
   an intensity comparator comparing each of the determined emission intensities to a corresponding reference intensity;
   an output circuit outputting the comparison results.

25. The system of claim 24, further comprising a monitor displaying a plot of each determined emission intensity against a corresponding reference intensity.

* * * * *